United States Patent
Weng et al.

[11] Patent Number: 5,972,234
[45] Date of Patent: Oct. 26, 1999

[54] DEBRIS-FREE WAFER MARKING METHOD

[75] Inventors: Kuo-Yao Weng; Yu-Chi Lin, both of Hsin-Chu, Taiwan

[73] Assignee: Taiwan Semiconductor Manufacturing Co., Ltd., Hsin-Chu, Taiwan

[21] Appl. No.: 09/055,378

[22] Filed: Apr. 6, 1998

[51] Int. Cl.⁶ ............................... B44C 1/22; H01L 21/31
[52] U.S. Cl. ............................... 216/44; 216/43; 216/45; 438/401; 438/700
[58] Field of Search ................................. 216/43, 44, 45; 438/401, 700

[56] References Cited

U.S. PATENT DOCUMENTS

| | | | |
|---|---|---|---|
| 5,668,030 | 9/1997 | Chung et al. ........................... | 438/401 |
| 5,759,873 | 6/1998 | Kata et al. ............................... | 438/118 |
| 5,877,064 | 3/1999 | Chang et al. ........................... | 438/401 |

*Primary Examiner*—Bruce Breneman
*Assistant Examiner*—Shamim Ahmed
*Attorney, Agent, or Firm*—Tung & Associates

[57] ABSTRACT

The present invention discloses a method for marking an electronic substrate without the splatter or debris defect which can be carried out by first providing a tape, then creating a cavity or a mark through the tape by a high-intensity energy beam or any other suitable mechanical means such that the tape can be laminated to a top surface of the substrate and exposed to an etchant until a similar mark in the substrate is reproduced by the etching process. After the tape is removed, the mark is reproduced in the surface of the electronic substrate.

22 Claims, 1 Drawing Sheet

DEBRIS-FREE WAFER MARKING METHOD

FIELD OF THE INVENTION

The present invention generally relates to a method for marking a substrate without the splatter defect in a semiconductor process and more particularly, relates to a splatter-free and debris-free wafer marking process in which a marked polymeric tape is first mounted onto a wafer surface which is then etched by either a dry etchant or a wet etchant to reproduce the mark in the wafer surface.

BACKGROUND OF THE INVENTION

In the fabrication of semiconductor devices, marks of numerical or alphanumerical numbers are frequently placed on surfaces of semiconductor substrates for identification purpose. The identification marks are provided such that different lots of semiconductor substrates can be tracked in the numerous fabrication processes. For instance, the identification marks can be used for identifying a defectively manufactured batch of substrates when a quality problem or defect has been discovered. The identification marks may also be used to conveniently identify different lots of semiconductor substrates that have different characteristics or properties.

Traditionally, identification marks on semiconductor substrates, such as silicon wafers, are provided by using a laser scribing technique wherein an identification mark is directly scribed into a top surface layer of a silicon wafer. During such scribing process, dots or spots are generated in the surface of a silicon wafer by melting the silicon material with a high-intensity energy beam such as laser. The high-intensity, focused laser beam is absorbed very close to the wafer surface. The: degree of absorption is dependent upon the wavelength of the laser used, the type of the laser used, the pulse length and many other factors. When laser is used to make a mark in silicon, the laser beam pause heats up the material until it melts. A crater is thus formed which has a circular ridge around a dot or bulge in a melted zone.

Contamination problems are frequently caused by a laser scribing process conducted in a silicon surface. For instance, debris can be generated when the liquified silicon material is ejected as droplets and then propelled by the expansion of the vapor formed. The liquid droplets fall to the surface of the wafer and then solidify into splatter debris. In a later processing step, when the wafer surface is pressed down by a wafer holding device such as a clamp ring, the splattered debris shatters and separates from the wafer surface becoming contaminating particles.

In a semiconductor fabrication process based on silicon wafers, an ideal time to mark the wafer for achieving a debris-free marking is to perform the task on a bare silicon surface, prior to the deposition of any other material layers on top. In practice, however, present fabrication process prefers to mark the wafer with a lot number after one or more wafer processing steps have been performed on the bare silicon. For instance, after a gate oxide layer or a silicon nitride insulating layer has been deposited on top of the bare silicon. A delayed marking, process on a silicon wafer enables a more flexible fabrication process to be carried out on a production line by keeping work-in-progress wafer inventory down. Another reason for delaying the marking of wafers is that once the wafer is marked, it is dedicated to a specific chip design or to a customer.

An undesirable side effect of delaying the wafer marking process is that it becomes more difficult to obtain a splatter-free or a debris-free mark on the wafer, since the various deposited layers on the silicon surface have different laser absorption characteristics and thus, melt or disintegrate differently under a high-intensity laser beam. Furthermore, due to the thickness of the additional material layers on top of the silicon surface, more splattered material is generated which presents opportunities of producing more contaminating particles when such splattered material is later crushed by a wafer holding device.

It is therefore an object of the present invention to provide a splatter-free, debris-free wafer marking method that does not have the drawbacks or shortcomings of the conventional wafer marking methods.

It is another object of the present invention to provide a debris-free marking method for electronic substrates wherein a high-intensity energy beam is not used to scribe directly into a substrate surface.

It is a further object of the present invention to provide a debris-free marking method for electronic substrates by utilizing a tape of polymeric material and marking the tape with an identification mark by a high-intensity energy beam.

It is another further object of the present invention to provide a debris-free marking method for a silicon wafer by first marking a polymeric tape with an identification mark and then adhering the tape to the wafer surface and carrying out an etching process.

It is still another object of the present invention to provide a debris-free marking method for a silicon wafer by first marking a polymeric tape within an identification mark and then adhering the tape to the wafer surface for exposing to a dry etchant in a reactive ion etching process.

It is yet another object of the present invention to provide a debris-free marking method for a silicon wafer by first marking a polymeric tape within an identification mark and then laminating the tape to a wafer surface and exposing the wafer to a wet etchant in a wet dipping process.

It is still another further object of the present invention to provide a debris-free marking method for a silicon wafer by first marking a polymeric based tape, adhering the tape to the silicon wafer and then exposing the wafer to a first etchant effective in etching through a first insulating layer, and then exposing the wafer to a second etchant effective in etching through a second insulating layer for reproducing the identification mark.

It is yet another further object of the present invention to provide a debris-free marking method for a thin film transistor substrate by first marking a polymeric tape with an identification mark, gluing the tape to the substrate and then reproducing the mark in the substrate surface by an etching process.

SUMMARY OF THE INVENTION

In accordance with the present invention, a debris-free marking method for an electronic substrate by utilizing a polymeric tape that is marked with an identification mark and then gluing the tape to the substrate and subsequently etching the mark into the substrate by an etching process is provided.

In a preferred embodiment, a method for marking a substrate without the splatter defect can be carried out by the operating steps of first providing a substrate that has a first surface to be marked, providing a tape, creating a cavity through the tape in the shape of a mark, adhering the tape to the first surface of the substrate, exposing the substrate and the tape to an etchant until a mark in the substrate is created, and removing the tape from the first surface of the substrate.

The method may further include the step of providing a substrate of a silicon wafer which has a first surface to be marked or a substrate for a thin film transistor. The tape provided is generally made of an insulating material, one of such suitable insulating material is a polymeric based material. The method may include the step of creating a cavity through the tape representing an alphanumerical mark, and the step of creating a cavity through the tape by a high-intensity energy beam such as a laser beam. The method may further include the step of creating a cavity through the tape representing a mark by a laser direct write process. The tape provided may be an adhesive-backed tape or the process may be carried out by first providing a layer of adhesive to the first surface of the substrate prior to the laminating step. The method may also include the step of exposing the substrate and the tape to a dry etchant in a reactive ion etching process or to a wet etchant in a wet dipping process.

In another preferred embodiment, a method for marking a silicon wafer without generating debris can be carried out by the operating steps of providing a silicon wafer that has a top surface to be marked, providing a polymeric material based tape, creating at least one cavity through the tape showing at least one mark, laminating the tape to the top surface of the silicon wafer, contacting the wafer and the tape with an etchant for a length of time until the at least one mark is reproduced in the silicon wafer, and then removing the tape from the top surface of the wafer. The method may include the step of creating the at least one cavity through the tape by a high-intensity energy beam such as a laser beam. The method may further include the step of providing an adhesive-backed polymeric based tape. The method may also include the step of contacting the wafer and the tape by a dry etchant or a wet etchant.

In an alternate embodiment of the present invention, a method for marking a semiconductor wafer without generating debris can be conducted by the steps of providing a semiconductor wafer which has a first insulating layer and a second insulating layer sequentially deposited on top, providing a polymeric material based tape, producing at least one cavity through the tape showing at least one mark, laminating the tape to the top surface of the second insulating layer on the semiconductor wafer, exposing the semiconductor wafer to a first etchant effective in etching through the second insulating layer, exposing the semiconductor wafer to a second etchant effective in etching through the first insulating layer, and then removing the tape from the top surface of the second insulating layer. The first etchant and the second etchant can be either a wet etchant or a dry etchant. The semiconductor wafer may be a silicon wafer or a thin film transistor substrate. The at least one cavity can be produced by a high-intensity energy beam.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND ALTERNATE EMBODIMENTS

Figure 1:
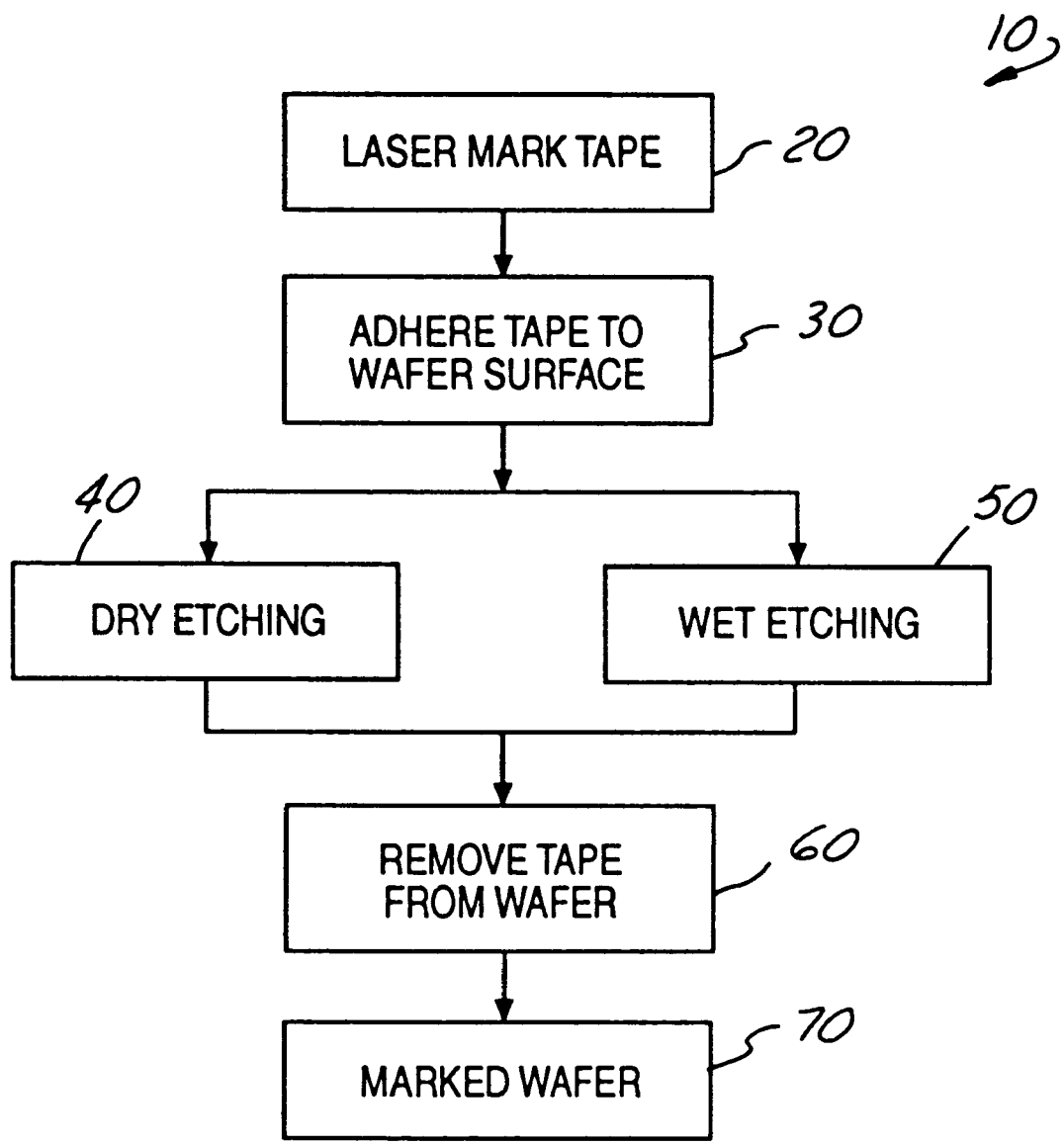
FIG. 1 is a process flow chart for the present invention method of producing identification mark on a semiconductor substrate without the splatter or debris defect.

The present invention provides a method for marking an electronic substrate without the splatter and debris defects by using a tape preferably of the insulating type and marking an identification mark in the tape by a high-intensity energy source, adhering the tape to a surface of the electronic substrate and then etching the surface of the substrate by a dry etching or wet etching method to reproduce the identification mark in the substrate. Since the surface of the electronic substrate is not scribed by the high-intensity energy source, no splatter or debris of the substrate material is generated such that a major contamination source is eliminated. The present invention novel method provides a greatly improved result over a conventional method in which a high-intensity energy beam is used to scribe directly on the surface of an electronic substrate, i.e., such as a silicon, wafer surface, to produce an identification mark by melting the surface layer of the silicon wafer.

In the present invention method, as shown in a process flow chart of FIG. 1, various electronic substrates may be suitably marked. These substrates include a silicon wafer, a ceramic or glass substrate for thin film transistors and any other suitable electronic substrate materials that is utilized in the fabrication of electronic devices. In the preferred embodiment illustrated, the marking process for a silicon wafer is given. However, it is to be understood that the present invention novel process is in no way limited to the marking of silicon wafers.

In the present invention novel process 10 shown in FIG. 1, a tape is first provided for the step of laser marking tape 20. Any suitable tape can be used in the present invention novel method. For instance, a tape made of insulating material that has a high absorption rate for a high-intensity energy beam is generally utilized. One of such suitable insulating materials is a polymeric based material. A polymeric based material can be easily patterned by high-intensity energy beams such as ultraviolet light or laser. For instance, a tape can be patterned by ultraviolet light in a process that is generally known as ablative photodecomposition which employs an excimer laser as the light source. The process can be demonstrated on a polymeric based tape such as one made of polyethylene terephthalate (PET), ethylene vinyl acetate (EVA), polyvinyl chloride (PVC), polyolefin (PO) or any other suitable polymeric material. In a typical patterning, or marking process by an excimer laser, the process is characterized by an apparent lack of melting and charring. The process can be carried out at relatively low temperatures of the ejected molecular fragments. The etching of polymeric based materials with an excimer laser beam can be carried out at hundreds of angstroms per pulse, while a typical excimer laser operates at hundreds of pulses per second. For instance, lasers such as a neodymium-doped yttrium aluminum garnet (Nd, YaG) laser, a semiconductor diode-pumped yttrium lithium fluoride (Nd, YLF) laser or any other excimer laser can be suitably used.

The excimer lasers can be used on a polymeric based tape in a laser direct write process for generating a pattern (or a marking) through the tape material. The marking may be a numerical marking, an alphanumerical marking or any other suitable markings.

After a marked tape is prepared, the tape is laminated to the surface of an electronic substrate, i.e., a silicon wafer, by any suitable methods. For instance, an adhesive layer may be applied between the surfaces of the electronic substrate and the tape. Another suitable method is to utilize a polymeric based tape that has adhesive backing. This is shown as step 30 in FIG. 1. For example, a suitable adhesive to be utilized may be an acrylic type polymer. When an adhesive-backed polymeric tape is used, an extra release layer, or a separator, may be first provided to cover the adhesive layer for protection during the laser marking process. The release layer may be formed of any suitable material such as polypropylene or PET. The lamination process for joining the polymeric based tape onto the wafer surface can be carried out in an apparatus similar to that used in applying an adhesive tape to the backside of a wafer prior to a grinding operation. The apparatus is readily available in the semiconductor processing industry.

After a patterned polymeric based tape is securely mounted to the surface of a silicon wafer, the laminated composite can be processed in either a dry etching step 40 or a wet etching step 50. In a dry etching step, a process such as reactive ion etching can be suitably used for etching into the silicon surface layer and thus reproducing the pattern, or the identification mark. Depending on the material of the electronic substrate to be etched under the tape, suitable etchant gases may be selected for the process. For instance, for the etching of a silicon wafer surface, a gas mixture of either $C_2F_6/Cl_2$/He or $Cl_2$/HBr may be used. The dry etching process provides the benefit of easier handling and furthermore, the backside of the wafer does not need to be protected. In a wet etching process 50, a wet dipping method utilizing a mixture of nitric acid ($HNO_3$) and hydrofluoric acid (HF) or any other suitable mixtures for etching silicon surface can be used. The wet etching process can be conducted at a lower cost, even though, the backside of the wafer or the electronic substrate must be protected.

In the final steps 60 and 70 of the process, the polymeric based tape is removed from the surface of the wafer (or the electronic substrate) to produce a wafer marked with the desirable identification mark. The removal step of the tape from the wafer surface may also be carried out in an apparatus that is normally used in the semiconductor fabrication industry for removing a backside adhesive film after a grinding process. A completed, marked wafer without the polymeric tape can then be cleaned with deionized water in a megasonic cleaning process to remove any residue of the adhesive.

The polymeric based tape utilized in the present invention novel method generally has a thickness of about 0.5 mm. It can be provided either with an adhesive backing or without an adhesive backing. The polymeric based tape may also be laminated to the surface of the electronic substrate by any other means without using the adhesive layer. The etching step, either by dry etching or wet etching, should be conducted for a sufficient length of time until a suitable thickness of the substrate layer is removed to sufficiently identify the mark. The sufficient length of time may be a time period between approximately ½ minute to approximately 20 minutes. The pattern, or mark generated in the tape may be in a continuous manner or in a discontinuous manner such as in a multiplicity of cavities or apertures.

In an alternate embodiment, the present invention novel method may also be carried out on electronic substrates that has at least one layer of coating material deposited on the substrate. For instance, insulating layers such as silicon oxide or silicon nitride may have been formed or deposited on top of the silicon wafer. In such applications, after a patterned tape is first laminated on top of the substrate, more than one etching process or a single etching process comprises more than one etching steps may need to be conducted such that a mark may be etched through all the layers. In an example of a silicon wafer that has a silicon oxide and a silicon nitride layer formed and deposited on top, a first etchant, or a first etching process should be conducted to remove the silicon nitride layer and then followed by a second etching process or a second etchant for removing the silicon oxide layer to produce the mark. The type of etchant used, or the type of etching process utilized, obviously depends on the material of the coating layers on the substrate. A further etching process into the base substrate layer, i.e., the silicon layer, may also be necessary depending on the type of mark desired.

The present invention novel method has therefore been amply described in the above descriptions and in the appended drawing of FIG. 1. It is to be noted that, while the marking of a silicon wafer by a laser beam is illustrated as an example of the present invention method, the method is in no way limited to the marking of silicon wafer by a laser beam. Any other surfaces of electronic substrates can be suitably marked by any other high-intensity energy beams.

While the present invention has been described in an illustrative manner, it should be understood that the terminology used is intended to be in a nature of words of description rather than of limitation.

Furthermore, while the present invention has been described in terms of a preferred and an alternate embodiment, it is to be appreciated that those skilled in the art will readily apply these teachings to other possible variations of the inventions.

The embodiment of the invention in which an exclusive property or privilege is claimed are defined as follows:

We claim:

1. A method for marking a substrate without the splatter defect comprising the steps of:
   providing a substrate having a first surface to be marked,
   providing a tape,
   creating a cavity through the tape in the shape of a mark,
   laminating the tape to said first surface of the substrate,
   exposing said substrate and tape to an etchant until a mark in said substrate is created, and
   removing the tape from said first surface of the substrate.

2. A method for marking a substrate according to claim 1 further comprising the step of providing a substrate of a silicon wafer having a first surface to be marked.

3. A method for marking a substrate according to claim 1 further comprising the step of providing a substrate for a thin film transistor having a first surface to be marked.

4. A method for marking a substrate according to claim 1, wherein said tape provided is made of an insulating material.

5. A method for marking a substrate according to claim 1, wherein said tape provided is made of a polymeric material.

6. A method for marking a substrate according to claim 1 further comprising the step of creating a cavity through the tape representing an alphanumerical mark.

7. A method for marking a substrate according to claim 1 further comprising the step of creating a cavity through the tape representing a mark by a high-intensity energy beam.

8. A method for marking a substrate according to claim 1 further comprising the step of creating a cavity through the tape representing a mark by a laser beam.

9. A method for marking a substrate according to claim 1 further comprising the step of creating a cavity through the tape representing a mark by a laser direct write process.

10. A method for marking a substrate according to claim 1 further comprising the step of providing an adhesive-backed tape.

11. A method for marking a substrate according to claim 1 further comprising the step of providing a layer of adhesive to said first surface of the substrate prior to the laminating step.

12. A method for marking a substrate according to claim 1 further comprising the step of exposing said substrate and tape to a dry etchant in a reactive ion etching process.

13. A method for marking a substrate according to claim 1 further comprising the step of exposing said substrate and tape to a wet etchant in a wet dipping process.

14. A method for marking a silicon wafer without generating debris comprising the steps of:

provoding a silicon wafer having a top surface to be marked, providing an insulating tape, creating at least one cavity through the tape showing at least one mark, laminating the tape to the top surface of the silicon wafer, contacting the wafer and the tape with an etchant for a sufficient length of time until said at least one mark is reproduced in said silicon wafer, and removing said tape from said top surface of the wafer.

15. A method for marking a silicon wafer according to claim 14 further comprising the step of creating at least one cavity through the tape by a high-intensity energy beam.

16. A method for marking a silicon wafer according to claim 14 further comprising the step of creating at least one cavity by a laser beam.

17. A method for marking a silicon wafer according to claim 14 further comprising the step of providing an adhesive-backed polymeric material based tape.

18. A method for marking a silicon wafer according to claim 14 further comprising the step of contacting the wafer and the tape by a dry etchant or a wet etchant.

19. A method for marking a semiconductor wafer without generating debris comprising the steps of:

providing a semiconductor wafer having a first insulating layer and a second insulating layer sequentially deposited on top, providing a polymeric material based tape, producing at least one cavity through the tape showing at least one mark, laminating the tape to a top surface of the second insulating layer on the semiconductor wafer, exposing the semiconductor wafer to a first etchant effective in etching through said second insulating layer, exposing the semiconductor wafer to a second etchant effective in etching through said first insulating layer, and removing the tape from the top surface of the second insulating layer.

20. A method for marking a semiconductor wafer according to claim 19, wherein said first etchant and said second etchant are selected from the group consisting of a wet etchant and a dry etchant.

21. A method for marking a semiconductor wafer according to claim 19, wherein said semiconductor wafer is a silicon wafer.

22. A method for marking a semiconductor wafer according to claim 19, wherein said at least one cavity is produced by a high-intensity energy beam.

* * * * *